(12) United States Patent
Ishiura

(10) Patent No.: US 9,577,142 B2
(45) Date of Patent: Feb. 21, 2017

(54) PROCESS FOR FORMING SEMICONDUCTOR LASER DIODE IMPLEMENTED WITH SAMPLED GRATING

(71) Applicant: Sumitomo Electric Device Innovations, Inc., Yokohama-shi (JP)

(72) Inventor: Masami Ishiura, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/926,579

(22) Filed: Oct. 29, 2015

(65) Prior Publication Data

US 2016/0126700 A1 May 5, 2016

(30) Foreign Application Priority Data

Oct. 30, 2014 (JP) ................. 2014-221118

(51) Int. Cl.
| | | |
|---|---|---|
| *H01L 33/00* | (2010.01) | |
| *H01L 33/10* | (2010.01) | |
| *H01S 5/227* | (2006.01) | |
| *H01S 5/0625* | (2006.01) | |
| *H01S 5/12* | (2006.01) | |
| *H01S 5/026* | (2006.01) | |
| *H01S 5/50* | (2006.01) | |

(52) U.S. Cl.
CPC ......... *H01L 33/0062* (2013.01); *H01L 33/10* (2013.01); *H01S 5/0265* (2013.01); *H01S 5/06258* (2013.01); *H01S 5/1209* (2013.01); *H01S 5/2275* (2013.01); *H01S 5/0261* (2013.01); *H01S 5/50* (2013.01)

(58) Field of Classification Search
CPC .............................. H01S 5/2275; H01L 33/10
See application file for complete search history.

(56) References Cited

U.S. PATENT DOCUMENTS

| | | | | |
|---|---|---|---|---|
| 2004/0001522 | A1* | 1/2004 | Mori | H01S 5/12 372/50.11 |
| 2008/0144691 | A1* | 6/2008 | Hatori | H01S 5/12 372/98 |
| 2010/0322557 | A1* | 12/2010 | Matsuda | B82Y 20/00 385/37 |
| 2011/0292960 | A1 | 12/2011 | Shoji et al. | |
| 2012/0002285 | A1* | 1/2012 | Matsuda | B82Y 20/00 359/576 |
| 2012/0058581 | A1* | 3/2012 | Tsuji | H01S 5/12 438/31 |
| 2013/0011947 | A1* | 1/2013 | Yanagisawa | G03F 7/0002 438/29 |

FOREIGN PATENT DOCUMENTS

| | | |
|---|---|---|
| JP | 2011-249619 A | 12/2011 |
| JP | 2012-174938 A | 9/2012 |

* cited by examiner

*Primary Examiner* — Michael Jung
(74) *Attorney, Agent, or Firm* — Venable LLP; Michael A. Sartori; F. Brock Riggs

(57) ABSTRACT

A method to produce a semiconductor laser diode (LD) including a sampled grating (SG) is disclosed. The method prepares various resist patterns each including grating regions and space regions alternately arranged along an optical axis. The grating regions and the space region in respective cavity types have total widths same with the others but the grating regions in respective types has widths different from others. After the formation of the grating patterns based on the resist patterns, only one of the grating patterns is used for subsequent processes.

21 Claims, 12 Drawing Sheets

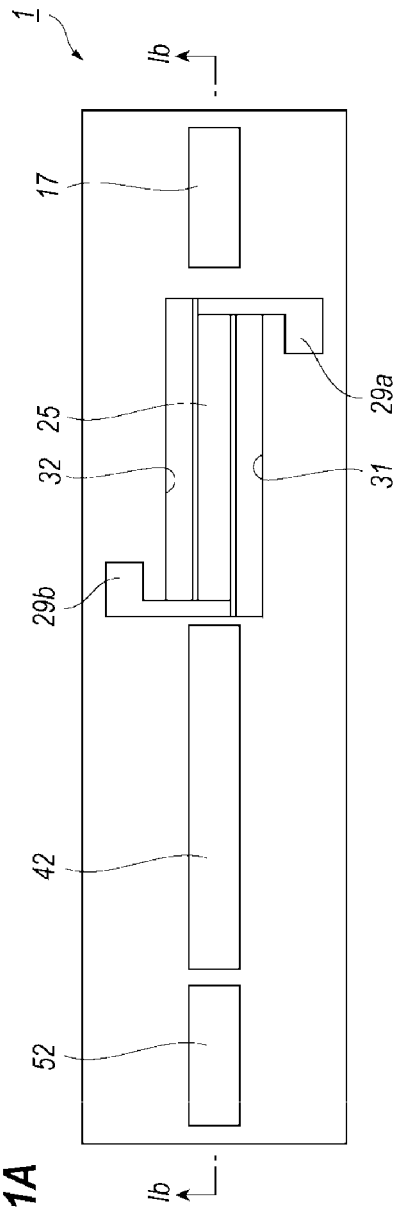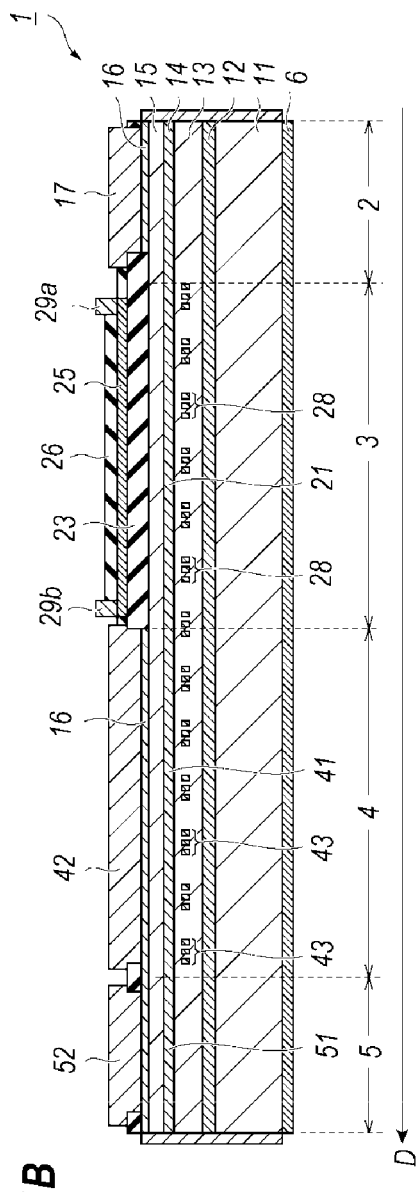

PROCESS FOR FORMING SEMICONDUCTOR LASER DIODE IMPLEMENTED WITH SAMPLED GRATING

BACKGROUND

1. Field of the Invention

The present invention relates to a process to form a semiconductor laser diode (LD), in particular, to form an LD implementing with a sampled grating.

2. Related Background Arts

A wavelength tunable LD usually provides an optical grating, especially, a sampled grating to tune an emission wavelength thereof, where the optical grating is often provided under an active layer, or a waveguide layer. A sampled grating has a structure with a number of grating regions formed at a constant interval, and each of the grating regions includes a number of gratings each having refractive index thereof different for those of neighbor regions. However, when the number of the gratings in one grating region, or when the gratings have physical shapes off from the desired one, such a sampled grating may show optical performance different from the designed one, or degraded from those of desired performance.

SUMMARY OF THE INVENTION

One aspect of the present application relates to a method to produce a semiconductor laser diode (LD) that provides a sampled grating (SG). The SG includes grating regions and space regions with no diffraction gratings, where the grating regions and the space regions alternately arranged along an optical axis of the LD. The method comprises steps of (1) forming a plurality of combinations of the grating regions and the space regions; (2) selecting one of the combinations of the grating regions and the space regions; and (3) removing the grating regions and the space regions in the unselected combinations. A feature of the method is that the grating region and the space region involved in one of the combinations have a summed length along the optical axis equal to a summed length along the optical axis of the grating region and the space region involved in the other of the combinations, but the grating region involved in the one of the combinations has a length along the optical axis different from a length along the optical axis of the grating region involved in the other of the combinations.

Another aspect of the present application relates to a method of forming an SG. The method comprises steps of: (1) epitaxially growing a first semiconductor layer and a second semiconductor layer in this order sequentially on a semiconductor substrate; (2) forming stripes made of first photoresist on the second semiconductor layer; (3) covering a portion of the stripes corresponding to the grating regions by a second photoresist; (4) removing a rest portion of stripes exposed by the second photoresist; (5) removing the second resist covering the portion of the stripes; (6) etching at least the second the semiconductor layer by using the first photoresist as an etching mask; (7) selecting one of the combinations of the grating regions and the space regions; and (8) embedding the etched second semiconductor layer by a third semiconductor layer.

The stripes formed in step (2) extend along a direction perpendicular to the optical axis and have one preset interval. The third layer processed in step (8) has refractive index substantially same with refractive index of the first semiconductor layer but different from refractive index of the second semiconductor layer. The etched second semiconductor layers are isolated by the first and third semiconductor layers. A feature of the process is that the step (3) is carried out so as to form a plurality of combinations of the grating regions and the space regions, where the grating region and the space region involved in one of the combinations have a summed length along the optical axis equal to a summed length along the optical axis of the grating region and the space region involved in the other of the combinations, but the grating region involved in the one of the combinations having a length along the optical axis different from a length along the optical axis of the grating region involved in the other of the combinations.

Still another aspect of the present application relates to a method of forming an SG. The method comprises steps of: (1) epitaxially growing a first semiconductor layer and a second semiconductor layer in this order sequentially on a semiconductor substrate; (2) forming stripes made of first photoresist on the second semiconductor layer; (3) covering a portion of the stripes corresponding to the space regions by a second photoresist as leaving the stripes in the grating regions; (4) etching at least the second semiconductor layer in the grating regions exposed by the second photoresist; (5) selecting one of combinations of the grating regions and the space regions; (6) removing the second photoresist covering the space regions; and (7) embedding the etched second semiconductor layer by a third semiconductor layer.

The stripes formed in step (2) extend along a direction perpendicular to the optical axis and have one preset interval. The third layer processed in step (7) has refractive index substantially same with refractive index of the first semiconductor layer but different from refractive index of the second semiconductor layer. The etched second semiconductor layers are isolated by the first and third semiconductor layers. A feature of the process is that the step (3) is carried out so as to form a plurality of combinations of the grating regions and the space regions, where the grating region and the space region involved in one of the combinations have a summed length along the optical axis equal to a summed length along the optical axis of the grating region and the space region involved in the other of the combinations, but the grating region involved in the one of the combinations have a length along the optical axis different from a length along the optical axis of the grating region involved in the other of the combinations.

BRIEF DESCRIPTION OF DRAWINGS

The invention will be described in conjunction with the accompanying drawings, in which:

FIG. 1A is a plan view of a laser diode (LD) according to the first embodiment of the present invention, and FIG. 1B shows a cross section taken along the line Ib-Ib indicated in FIG. 1A;

DESCRIPTION OF EMBODIMENTS

Figure 2A:
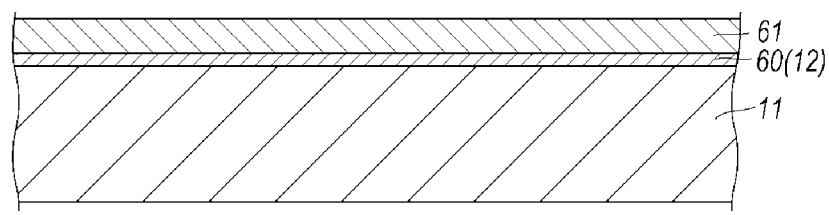
FIGS. 2A to 2C show cross sections of the semiconductor substrate at respective steps of the process to grow the first to third semiconductor layers, respectively.

Next, some preferred embodiments according to the present application will be described as referring to drawings. In the description of the drawings, numerals or symbols same with or similar to each other will refer to elements same with or similar to each other without duplicated explanations.

First Embodiment

FIG. 1A is a plan view of a laser diode (LD) according to the first embodiment of the present invention, and FIG. 1B shows a cross section taken along the line Ib-Ib indicated in FIG. 1A. As shown in FIGS. 1A and 1B, an LD 1 is a type of the distributed feedback (DFB) LD including, on a semiconductor substrate 11, an optical absorber 2, a sampled grating distributed Bragg reflector (SG-DBR) 3, a sampled grating distributed feedback (SG-DFB) 4, and a semiconductor optical amplifier (SOA) 5. The semiconductor substrate 11 and the regions, 2 to 5, are made of semiconductor materials of primarily indium phosphide (InP).

The optical absorber 2, the SG-DBR 3, the SG-DFB 4, and the SOA 5 are arranged along a direction D, which is in parallel to the optical axis of the LD 1, in this order on the semiconductor substrate 11. Light generated in the LD 1 propagates along this direction. The semiconductor substrate 11 provides a back metal 6 on a back surface thereof, which may be made of, for instance, stack of nickel (Ni)/gold germanium (AuGe)/gold (Au).

The optical absorber 2, which absorbs light generated in the LD 1, includes an adiabatic layer 12, a lower cladding layer 13, an absorbing layer 14, a upper cladding layer 15, a contact layer, and an electrode 17, where they are stacked in this order on the semiconductor substrate 11.

The adiabatic layer 12, which has thermal conductance lower than thermal conductance of the semiconductor substrate 11, may be made of InGaAsP, InGaAlAs, InAlAsP, and/or InGaAlAsP. Although the first embodiment shown in FIG. 1B has the adiabatic layer 12 of a single layer of InAlAsP, the adiabatic layer 12 may be a stack of InAlAsP/InGaAlAs, and so on. The adiabatic layer 12 has a thickness of, for instance, 1 to 3 μm.

The lower and upper cladding layers, 13 and 15, which extend in all regions, 2 to 5, optically confine light within the absorbing layer 14, a waveguide layer 21, an active layer 41, and an amplifying layer 51, where they will be described in detail later. The lower cladding layer 13 may be made of n-type InP with a thickness of 1 to 3 μm, and the upper cladding layer 15 may be made of p-type InP with a thickness of 1 to 2 μm.

The absorbing layer 14 may be made of material capable of absorbing light generated in the LD 1. For instance, the absorbing layer 14 may have the multi-quantum well (MQW) structure including a plurality of well layers each made of, for instance, InGaAsP and a plurality of barrier layers each made of also InGaAsP but a composition thereof is different from the composition of the well layers. The well layers and the barrier layers are alternately stacked to each other in the MQW structure. The absorbing layer 14 may have a thickness of 0.1 to 0.3 μm.

The contact layer 16 may be made of p-type InGaAsP with a thickness of 0.1 to 0.3 μm. The electrode 17, which makes an ohmic contact to the contact layer 16, may include a metal stack of nickel (Ni)/gold germanium (AuGe)/gold (Au). The electrode 17 is grounded in the present embodiment.

The SG-DBR 3 shows a function to reflect light. As shown in FIG. 1B, the SG-DBR 3 includes the adiabatic layer 12, the lower cladding layer 13, the waveguide layer 21, the upper cladding layer 15, a first insulating film 23, a heater 25, and a second insulating film 26 each stacked in this order on the semiconductor substrate 11. The waveguide layer 21, which constitutes a waveguide of the light generated in the LD 1, may propagate the light therein. The waveguide layer 21 may have the quantum well (QW) structure including InGaAsP. The waveguide layer 21 extends along the direction D of the propagation of the light.

As shown in FIG. 1B, the first insulating film 23, which is provided on the upper cladding layer 15, may be made of silicon oxide ($SiO_2$) or silicon nitride (SiN). The first insulating film 23 may be formed by, for instance, the sputtering, the chemical vapor deposition (CVD), the plasma-enhanced CVD, and/or the photo CVD. The heater 25 is a resistive element to generate heat provided with a current therein. The LD 1 of the embodiment may adjust a temperature of the waveguide 21 by the heater 25. The heater 25 may be made of alloy of titanium (Ti) and tungsten (W) or alloy of nickel (Ni) and chromium (Cr). The heater 25 is connected to the interconnections, 29a and 29b, made of metal or metals having conductivity greater than that of the heater 25. For instance, the interconnections, 29a and 29b, may be made of a stack of nickel (Ni)/gold germanium (AuGe)/gold (Au). One of the interconnections 29a is grounded, but the other 29b is connected to a power supply. The second insulating film 26, which is provided on the heater 25, may be also made of silicon oxide (SiO) and/or silicon nitride (SiN) with a thickness of 0.2 to 0.3 μm. The second insulating film 26 may be formed by, for instance, the sputtering, the CVD, the plasma enhanced CVD, and/or the photo CVD.

As shown in FIG. 1A, the SG-DBR 3 provides a pair of grooves, 31 and 32, putting the waveguide layer 21 therebetween. The grooves, 31 and 32, may be filled with resin or the like. A portion of the lower cladding layer 13 in the SG-DBR 3 provides diffraction gratings 28 made of materials having refractive index different from that of the lower cladding layer 21. For instance, when the lower cladding layer is made of InP, or material containing InP, the diffraction gratings 28 may be made of InGaAsP, or materials containing InGaAsP. The diffraction gratings 28 of the present embodiment include a plurality of isolated stripes, or isolated interfaces against the lower cladding layer 25.

The SG-DFB 4, which operates as a photon-generating or light-generating region in the LD 1, provides gain regions intermittently appearing along the optical axis of the LD, or, the direction D along which light propagates. As shown in FIG. 1B, the SG-DFB 4 includes an adiabatic layer 12, the lower cladding layer 13, the active layer 41, the upper cladding layer 15, the contact layer 16, and the electrode 42, where these layers are stacked on the semiconductor substrate 11 in this order. The lower cladding layer 13 periodically provides the diffraction gratings 43 whose arrangements are same with the diffraction gratings 28 in the SG-DBR 3.

The active layer 41, which may show an optical gain by being injected with carriers, may have the quantum well (QW) structure partially made of InGaAsP. The active layer 41 may be concurrently formed with the absorption layer 14 in the optical absorber 2. The electrode 42, which has arrangements and characteristics same with those 17 in the optical absorber 2, connects the contact layer 16 to the external power supply.

The SOA 5, which may amplify light generated in the SG-DFB 4, includes the adiabatic layer 12, the lower cladding layer 13, an amplifying layer 51, the upper cladding layer 15, the contact layer 16, and the electrode 52, where these layers are stacked on the semiconductor substrate 11 in this order.

The amplifying layer 51, which may amplify light generated in the LD 1, may have the QW structure partially made of InGaAsP. The amplifying layer 51 may be formed concurrently with the active layer 41 in the SG-DFB 4. The electrode 52, which has arrangements and characteristics same with those 42 in the SG-DFB 4, is connected to the power supply.

The absorbing layer 14 in the optical absorber 2, the waveguide layer 21 in the CSG-DBR 3, the active layer 41 in the SG-DFB 4, and the amplifying layer 51 in the SOA 5 optically couple with each other. A facet in the optical absorber 2 provides a reflective film, but the other facet in the SOA 5 provides an anti-reflective (AR) film with reflectance thereof smaller than 1.0%.

Next, a process to form the LD of the first embodiment will be described as referring to FIGS. 2A to 9B. FIGS. 2A to 2C and FIGS. 6A to 6C show cross sections of the LD 1 during respective steps of the process to form the LD 1. FIG. 3A is a plan view of the LD at a step of the process, FIG. 3B shows a cross section taken along the line IIIb-IIIb indicated in FIG. 3A; FIGS. 4A, 5A, 7A, 8A, and 9A are plan views showing the semiconductor substrate 11 at respective steps of the process that contain magnified views. FIG. 4B shows a cross section taken along the line IVB-IVB indicated in FIG. 4A, FIG. 5B also shows a cross section taken along the line Vb-Vb indicated in FIG. 5A; FIG. 7B shows a cross section taken along the line VIIb-VIIb, FIG. 7C also shows a cross section taken along the line VIIc-VIIc each appearing in FIG. 7A. FIG. 8B shows a cross section taken along the line VIIIb-VIIIb appearing in FIG. 8A, and FIG. 9B also shows a cross section taken along the line IXb-IXb indicated in FIG. 9A. The LD 1 in particular the SG-DFB 4 thereof may be produced by the process below described.

Figure 2B:
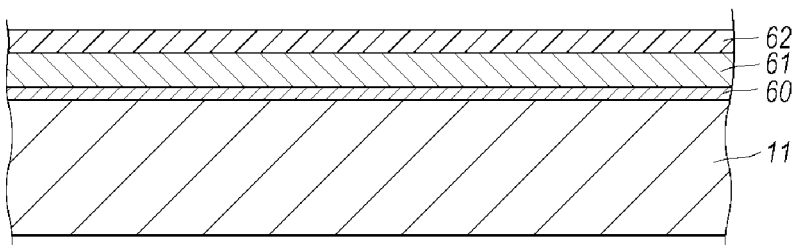
Figure 2C:
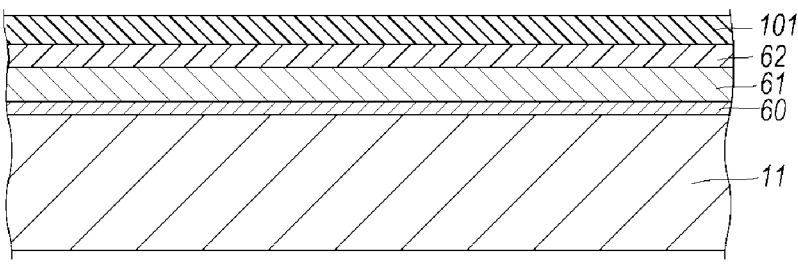
Figure 3A:
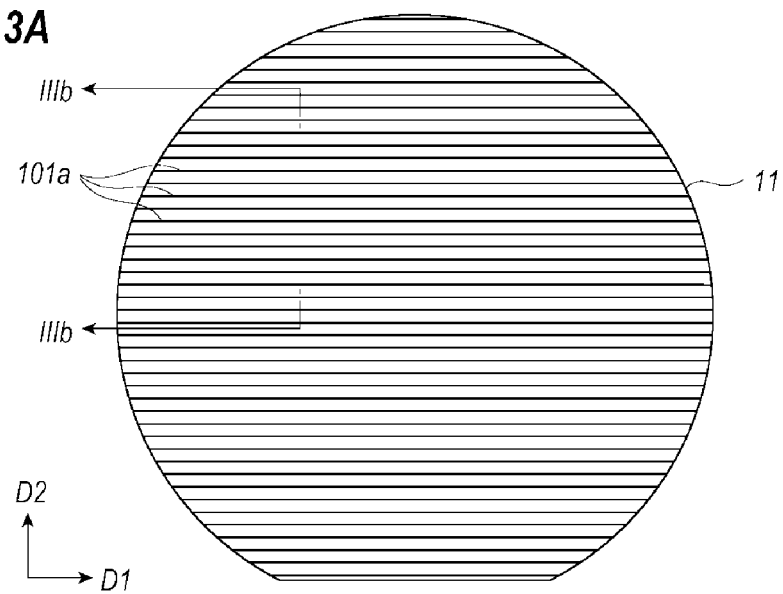
FIG. 3A is a plan view of the semiconductor substrate at a step of the process to form the resist stripes.
Figure 3B:
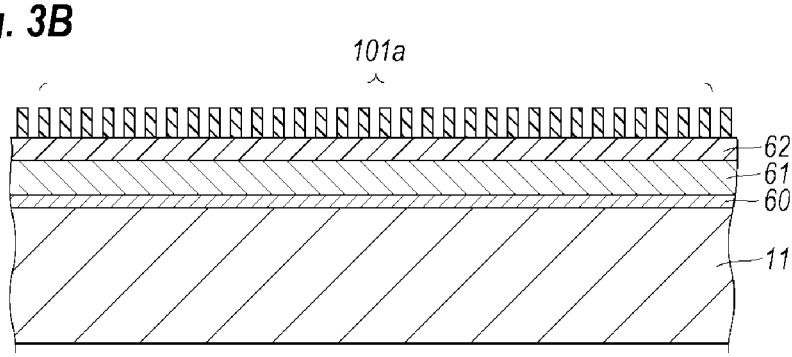
FIG. 3B shows a cross section of the semiconductor substrate taken along the line IIIb-IIIb indicated in FIG. 3A.

First, first and second semiconductor layers, 60 and 61, are epitaxially grown in this order on a primary surface of the semiconductor substrate 11 of, for instance, indium phosphide (InP), as shown in FIG. 2A. The first layer 60, which corresponds to the adiabatic layer 12 in the LD 1 may be made of InGaAsP with a thickness of about 1 μm. The second layer 61 may be made of n-type InP with a thickness of about 0.5 μm, which becomes a portion of the lower cladding layer 13. Then, as shown in FIG. 2B, a third semiconductor layer 62 is epitaxially grown on the second layer 61. The third layer 62 may be made of InGaAsP but compositions thereof are different from those of the second layer 61. The third semiconductor layer 62 may have a thickness of about 0.1 μm. Subsequently, a conventional coater process coats a surface of the third semiconductor layer 62 by a first photoresist 101 of the positive type with a thickness of about 0.2 μm as shown in FIG. 2C.

Next, as shown in FIGS. 3A and 3B, the coated photoresist 101 is patterned to form stripes each extending in parallel to the others and along a direction D1 indicated in FIG. 3A. Two beams interference exposure technique may form the resist stripes 101a as shown in FIGS. 3A and 3B. The description below assumes that a direction along which the resist stripes 101a extend is the direction "D1" and another direction intersecting or perpendicular to the former direction D1 is "D2".

Figure 4A:
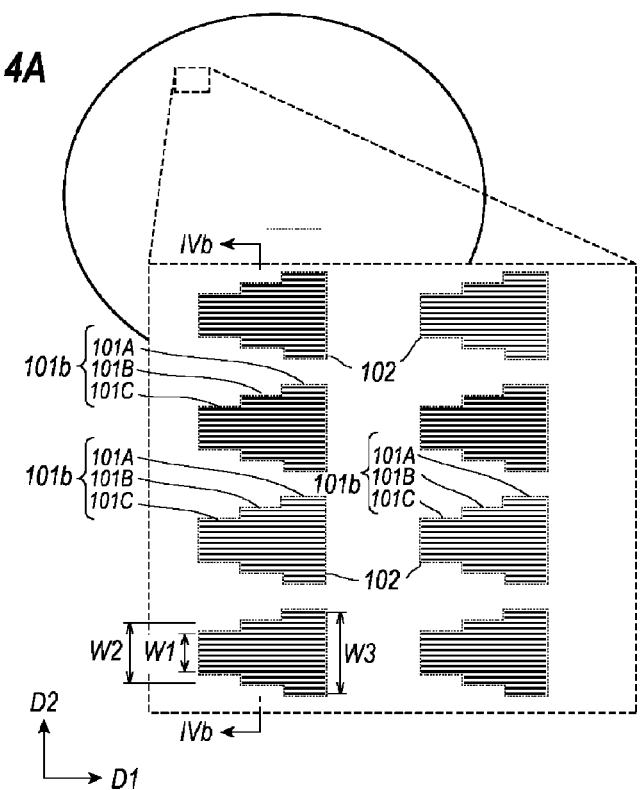
FIG. 4A is a plan view of the semiconductor substrate at a step of the process to cover the resist stripes in the grating region by the second photoresist.
Figure 4B:
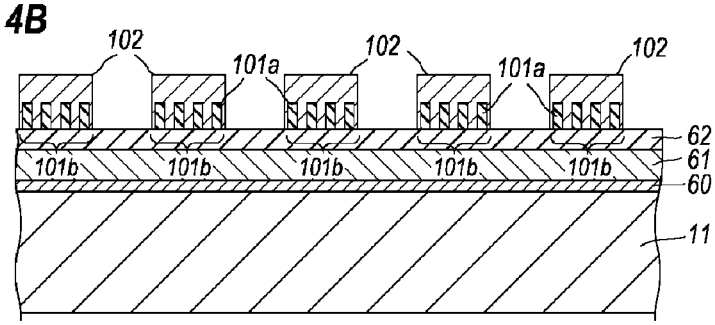
FIG. 4B shows a cross section of the semiconductor substrate taken along the line IVb-IVb indicated in FIG. 4A.

Next, as shown in FIGS. 4A and 4B, a lithography technique using a negative type photoresist, which is the second photoresist, may cover the collective patterns 101b each including a portion of the resist stripes, 101A to 101C, extending along the direction D2 with respective intervals between the collective patterns 101b different from others. Specifically, a negative type photoresist coats the whole resist stripes 101a of the first photoresist 101. Then the negative photoresist 102 is patterned by an exposure equipment of a stepper, an aligner, and so on using a reticle or a photomask so as to include the collective patterns of the resist stripes, 101A to 101C. Removing the negative type photoresist in areas not exposed to light by the development, removing the resist stripes 101a of the first photoresist 101 exposed from the negative type photoresist 102 by dry-etching, which is shown in FIGS. 4A and 4B, and further removing the negative type photoresist 102 by wert-etching, the collective patterns 101b each including the partial stripes, 101A to 101C, are left on the third semiconductor layer 62. As shown in FIG. 4A, the collective patterns 101b form an array extending along both directions, D1 and D2. Partial resist stripes, 101A to 101C, each have widths, W1 to W3, along the direction D2. Also, the partial resist stripes, 101A to 101C, include the resist stripes 101a whose counts are different from others in respective resist stripes, 101A to 101C. According to the resist works thus described, the collective patterns 101b of the first photoresist 101 are left in the grating regions in the SG, and no resist stripes 101a are left in the space regions in the SG.

Figure 5A:
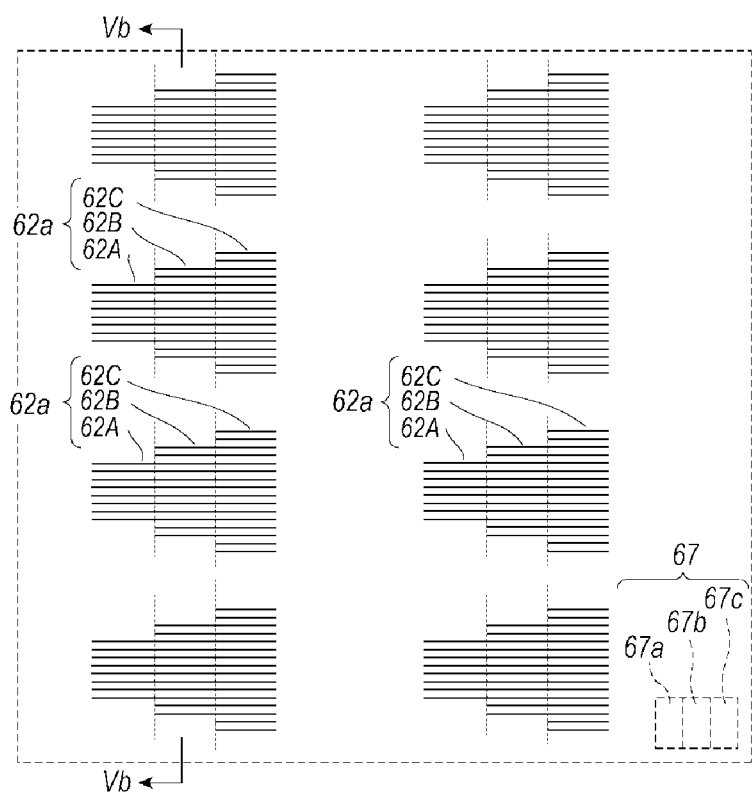
FIG. 5A is a plan view of the semiconductor substrate at a step of the process to form the diffraction grating patterns.
Figure 5B:
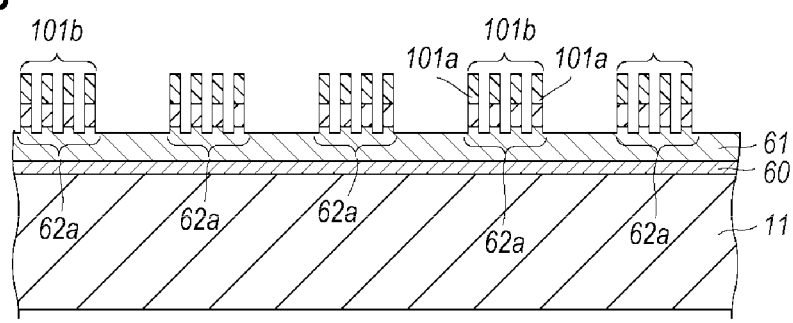
FIG. 5B shows a cross section of the semiconductor substrate taken along the line Vb-Vb indicated in FIG. 5A.

Next, as shown in FIGS. 5A and 5B, the process etches the second layer 62 by using the collective patterns 101b of the first photoresist 101 as an etching mask to form grating patterns 62a in the third semiconductor layer 62. Dry etching or wet etching may etch the third semiconductor layer 62. The etching may concurrently form various grating patterns, 62A to 62C, each having common and constant pitch between the stripes but different spaces between the collective patterns 62a. That is, the grating patterns 62a each have the partial diffraction grating patterns, 62A to 62C, each having stripes of the third semiconductor layer 62, the number of stripes in the collective pattern 62a coincides with the number of the striped resist patterns, 101A to 101C. The etching of the third semiconductor layer 62 is carried out until the second semiconductor layer 61 exposes, or, a surface portion of the second semiconductor layer 61 may be etched. The diffraction grating patterns, 62A to 62C, may be evaluated in the numbers, the widths, the shapes, the chipping and so on by, for instance, the scanning electron microscope (SEM).

The process, concurrently with the etching of the third semiconductor layer 62, forms an alignment mark 67 on the primary surface of the second semiconductor layer 61. The alignment mark 67 includes several regions, 67a to 67c, each corresponding to the diffraction grating patterns, 62A to 62C. As described, the respective diffraction grating patterns, 62A to 62C are inspected, and only one of the diffraction grating patterns, 62A to 62C is selected, where the embodiment assumes the second diffraction grating patterns 62B is selected because of quality thereof. The, the process also selects the mark region 67b corresponding to the second grating patterns 62B.

Figure 6A:
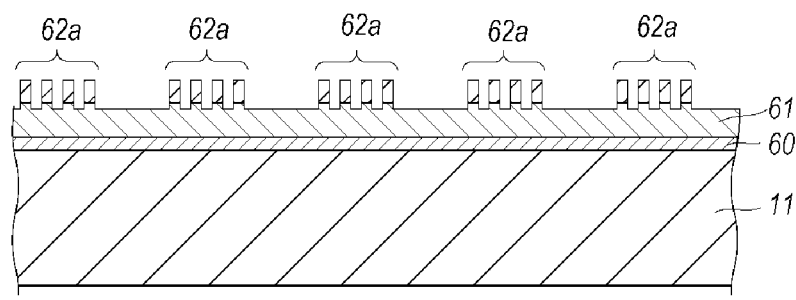
FIGS. 6A to 6C show cross sections of the semiconductor substrate at respective steps of the process to bury the diffraction grating patterns, and to grow additional semiconductor layers.
Figure 6B:
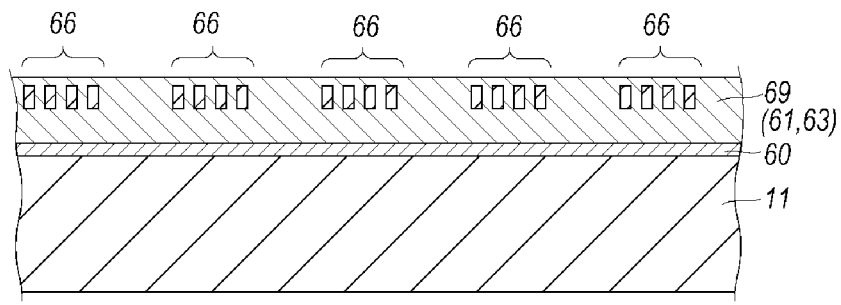
Figure 6C:
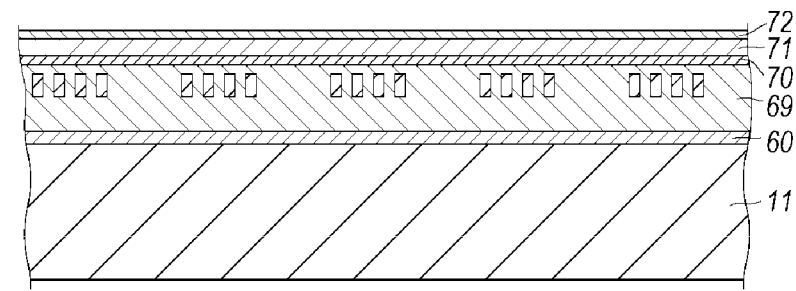

After removing the collective resist patterns 101b as shown in FIG. 6A, the diffraction grating patterns 62a are embedded by a fourth semiconductor layer 63, which is shown in FIG. 6B, as epitaxially growing the fourth semiconductor layer 63. The fourth semiconductor layer 63 may be made of n-type InP, which is the same with the second semiconductor layer 61. In an alternate, the fourth semiconductor layer 63 may be made of material having refractive index substantially same with that of the second semiconductor layer 61 but different from that of the third semiconductor layer 62 to be embedded thereby. Thus, the diffraction grating patterns, 62A to 62C, are fully surrounded by the second semiconductor layer 61 to become respective diffraction gratings 66 and the fourth semiconductor layer 63; that is, the second and fourth semiconductor layers, 61 and 63, becomes a common layer 69 to isolate the etched second semiconductor layers 62a.

The process next covers a region, where the CSG-DBR 3 is to be formed, by a mask made of inorganic material, typically silicon oxide ($SiO_2$). Then, fifth to seventh semiconductor layers, 70 to 72, are epitaxially grown on the combined semiconductor layer 69. The fifth layer 70, which becomes the active layer 41, may have a quantum well (QW) structure including InGaAsP, while, the sixth layer 71 may be a p-type InP, which becomes the upper cladding layer 15, and the seventh layer 72 may be a p-type InGaAs, which becomes the contact layer 16. Because the inorganic mask covers the region to be the CSG-DBR 3, the fifth to seventh layers, 70 and 72, are selectively grown only in regions for the optical absorber 2, the SG-DFB 4, and the SOA 5. After the growth of the fifth to seventh layers, 70 and 72, the process removes the inorganic mask. Subsequently, the process covers the seventh layer 72, and grows another layer having the QW structure selectively in the region for the CSG-DBR 3. This layer becomes the waveguide layer 21 in the CSG-DBR 3.

The process thus described may form three types of the cavity patterns, 91 to 93, for the laser emission on the semiconductor substrate 11. The cavity pattern 91 provides the grating regions 91a and the space regions 91b alternately arranged along the direction D2. Each of the grating regions 91a has the diffraction grating pattern 66a but the space regions 91b haves no diffraction grating patterns. Thus, the cavity pattern 91 has the SG of the first type. Similarly, the second cavity pattern 92 provides the grating regions 92a with the diffraction grating pattern 66b and the space regions 92b also alternately arranged along the direction D2. Thus, the second cavity pattern 92 has the SG of the second type. The cavity pattern 93 also provides the grating regions 93a with the diffraction grating pattern 66c and the space regions 93b alternately arranged along the direction D2. The third cavity pattern 93 has the SG of the third type. A feature of the process of the present invention is that total widths of the grating region and the space region in respective cavity patterns are equal to each other, but widths of the grating regions in the respective cavity patterns, 91 to 93, are different from others. That is, the respective grating regions, 91a to 93a, include the diffraction grating patterns 66a whose number is different from others, but have pitches between the grating regions, 91a to 93, equal to each other.

That is, the grating regions, 91a to 93a, as described above, have respective widths along the direction D2 different from others. Moreover, the numbers of grating patterns, 66a to 66c, are different in respective grating regions, 91a to 91b. Also, the space regions, 91b to 93b, have respective widths along the direction D2 different from others. However, respective sums of the widths of the grating regions, 91a to 91c, and the widths of the space regions, 91b to 93b, are substantially equal to each other. That is, the respective grating regions, 91a to 91c, have pitches, or intervals, along the direction D2 substantially equal to each other.

The respective cavity patterns, 91 to 93, includes the semiconductor layer 63, and the fifth to seventh semiconductor layers, 70 to 72, on the combined semiconductor layer 63. However, the cavity patterns, 91 to 93, in the optical absorber 2 and the OSA 5, where no diffraction gratings or no SG are provided, may omit the combined semiconductor layer 63.

Figure 7A:
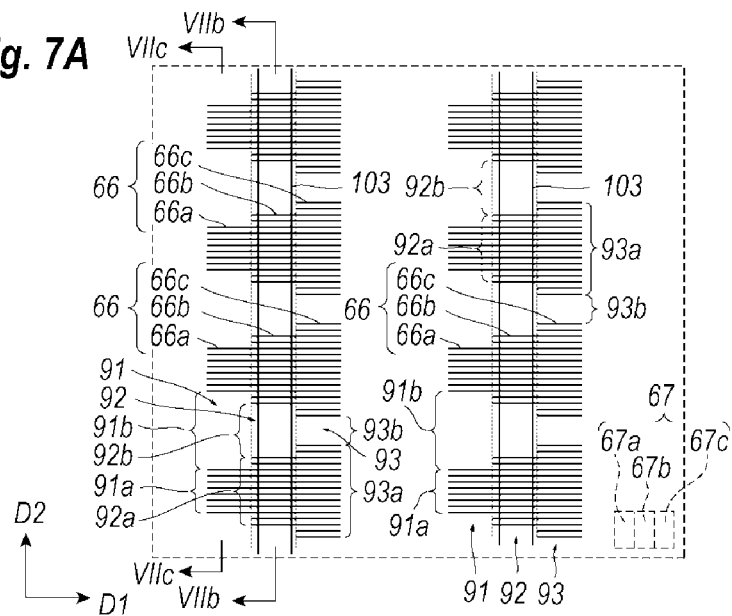
FIG. 7A is a plan view of the semiconductor substrate at a step of the process to select one of the cavity patterns.
Figure 7B:
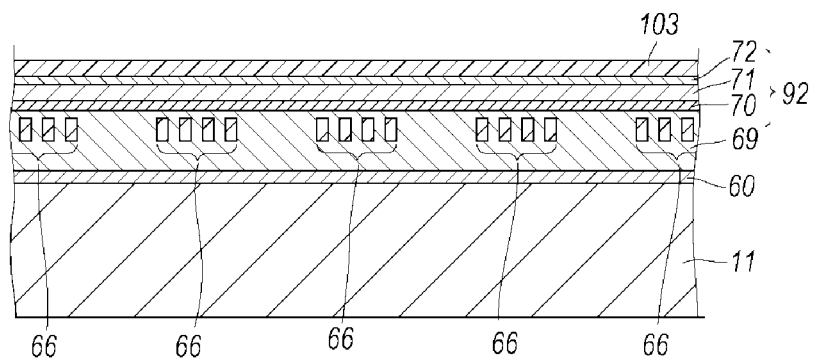
FIG. 7B shows a cross section of the semiconductor substrate taken along the line VIIb-VIIb in FIG. 7A, which corresponds to a selected cavity pattern.
Figure 7C:
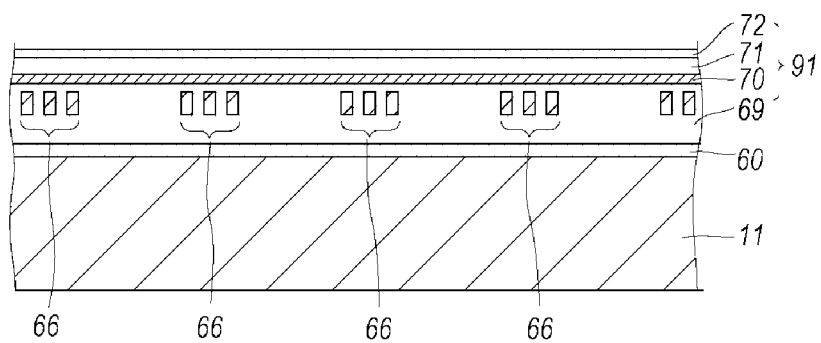
FIG. 7C shows a cross section of the semiconductor substrate taken along the line VIIc-VIIc in FIG. 7B, which corresponds to an unselected cavity pattern.

Referring to FIG. 7A, the process forms a mask 103 on one of the cavity patterns, 91 to 93, selected by the former process through the inspection of the diffraction grating patterns 62a. The mask 103 extends along the direction D2 and may be made of silicon oxide ($SiO_2$). The mask 103 has a width along the direction D1 narrower than the width of the cavity patters. In the first embodiment of the present invention, because the second region 67b provides the alignment mark 67 therein through the inspection of the diffraction grating patterns 62a, the mask 103 is formed in the second cavity pattern 92. When the first diffraction grating pattern 66a is selected by the inspection, the mask 103 is to be formed on the first cavity pattern 91. Similarly, in the case the third grating pattern 66c is selected, the third cavity pattern 93 forms the mask 103 thereon.

Figure 8A:
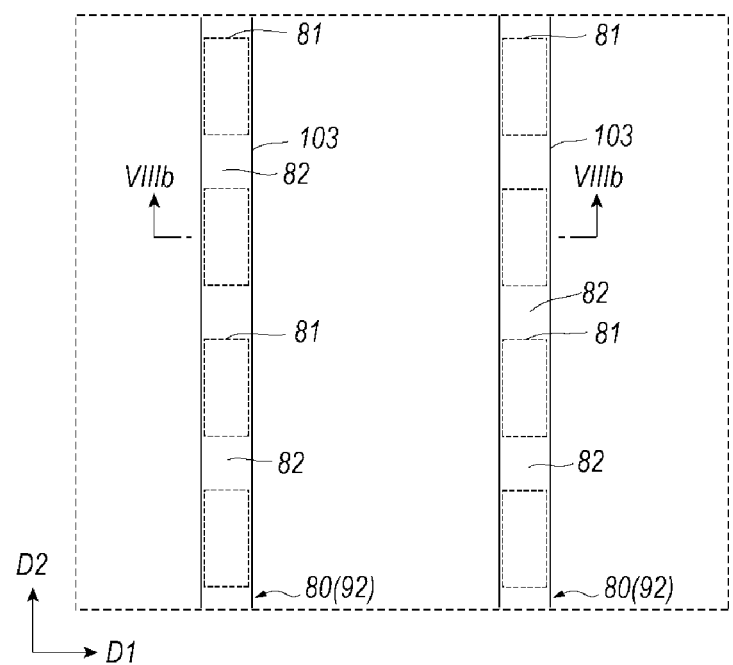
FIG. 8A is a plan view of the semiconductor substrate at a step of the process to from the mesa.
Figure 8B:
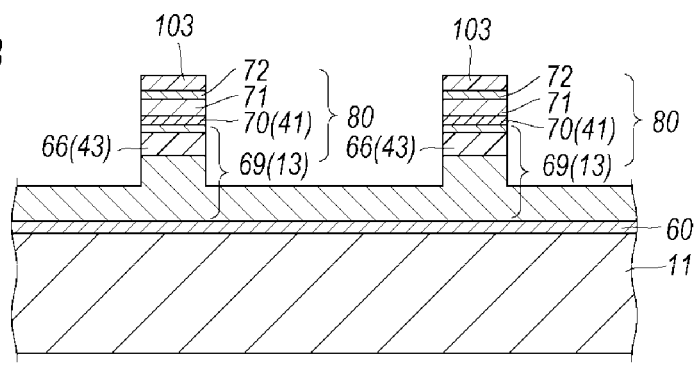
FIG. 8B shows a cross section of the semiconductor substrate taken along the line VIIIb-VIIIb appearing in FIG. 8A.

Next, the cavity patterns except for those not prepared with the mask 103, namely, the first and third cavity patterns, 91 and 93, are removed as leaving the selected cavity pattern 92. The removal of the cavity patterns, 91 and 93, may be carried out by dry etching and/or wet etching. This etching leaves mesas 80 each having the second cavity pattern 92 on the primary surface of the semiconductor substrate 11, as shown in FIG. 8A. The mesas 80 extend along the direction D2 and being apart from each other. The etching may remove portions of the second cavity pattern 92 not covered with the mask 72. That is, the mesas 80 have a width narrower than the width of the second cavity pattern 92. In other words, portions of the second cavity patterns 92 in respective sides thereof continuous to the first and third cavity patterns, 91 and 93, may be removed in the etching to form the mesas 80. Thus, the mesa stripes 80 have widths narrower than the width of the second cavity pattern 92.

The mesa stripes 80 includes the grating patterns 66b, which correspond to areas 81 surrounded by broken lines in FIG. 8A. The mesa stripes 80 between the areas 81, which are denoted by areas 82 in FIG. 8A, have no grating patterns. In the mesa stripes 80, the combined semiconductor layer 63, the fifth to seventh semiconductor layers, 70 to 72, and the diffraction grating patterns 66b, each correspond to the lower cladding layer 13, the active layer 41, the upper cladding layer 15, the contact layer 16, and the diffraction grating 43, refer to FIG. 1B. The diffraction gratings 43 exist in the mesa stripes 80 with a preset interval along the direction D2.

Figure 9A:
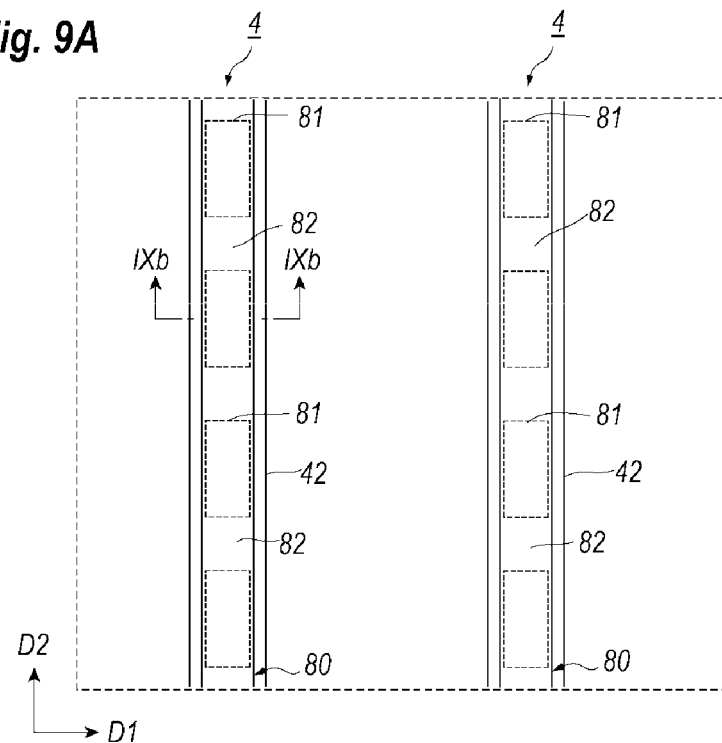
FIG. 9A is a plan view of the semiconductor substrate at a step of the process to bury the mesa.
Figure 9B:
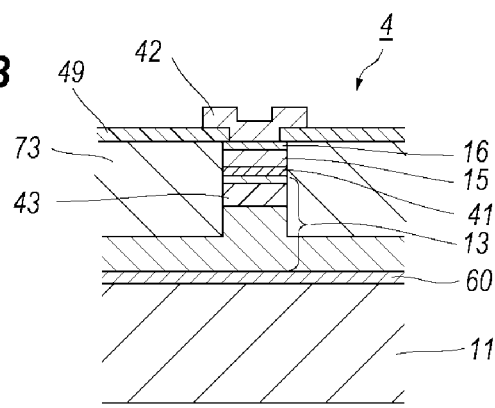
FIG. 9B shows a cross section of the semiconductor substrate taken along the line IXb-IXb indicated in FIG. 9A.

Removing the mask 103 made of inorganic material, the mesa stripes 80 are embedded by selectively grow the embedding layer 73 as shown in FIGS. 9A and 9B. Next, depositing an insulating film 49 on the mesa 80 and the embedding layer 73, forming an opening in the insulating film 49, and depositing the electrode 42 within the opening such that the electrode 43 is in contact with the contact layer 16, the LD of the present embodiment may be completed.

Advantages of the LD 11 produced by the process described above will be described. For instance, when the process omits the enveloped patterns 102 of the second photoresist which includes various grating patterns, 101A to 101C, shown in FIG. 4A; the grating regions sometimes include insufficient grating patterns 101b, which results in a degraded performance of the LD and sometimes such semiconductor substrate 11 providing a lacked grating patterns is removed from the production.

The present method to produce an LD selects only one of the cavity patterns, 91 to 93, each having the grating regions with specific widths along the optical axis of the LD 1, namely, each grating regions having respective counts of the diffraction grating patterns 66, and rest of the cavity patterns are removed. Thus, the LD 1 may provide the desired SG. The removal of the rest of the cavity patterns, 91 to 93, may be performed concurrently with the formation of the mesas 80. The mesas may have a width along the direction perpendicular to the optical axis narrower than the selected cavity pattern 92. That is, portions of the cavity pattern 92 in respective sides continuous to the other cavity patterns, 91 and 93, may be etched concurrently with the formation of the mesas 80. Thus, the mesas 80 securely include the diffraction patterns 66, that is, the diffraction patterns 66 extend from one edge to the other edge of the mesas 80, which may not degrade the performance of the diffraction grating thus formed. The method may further provide a step to bury the mesas 80 by embedding layers 73 to enhance the performance of the LD 1, in particular, the I-L (current to optical output) characteristic of the LD 1.

Second Embodiment

Figure 10A:
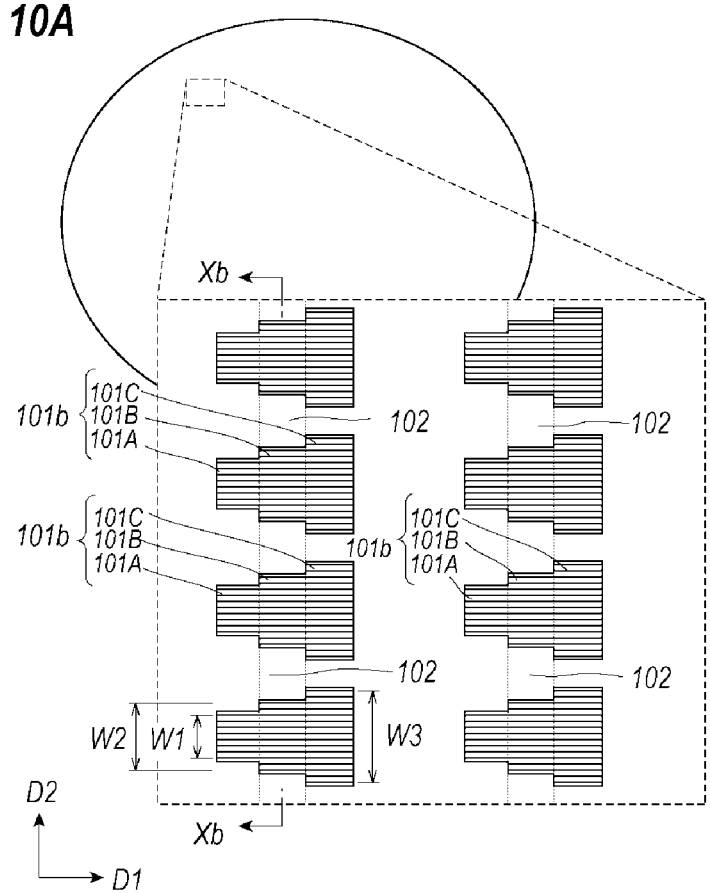
FIG. 10A is a plan view of the semiconductor substrate at a step of the process to form patterned resist stripes according to the second embodiment of the present invention.
Figure 10B:
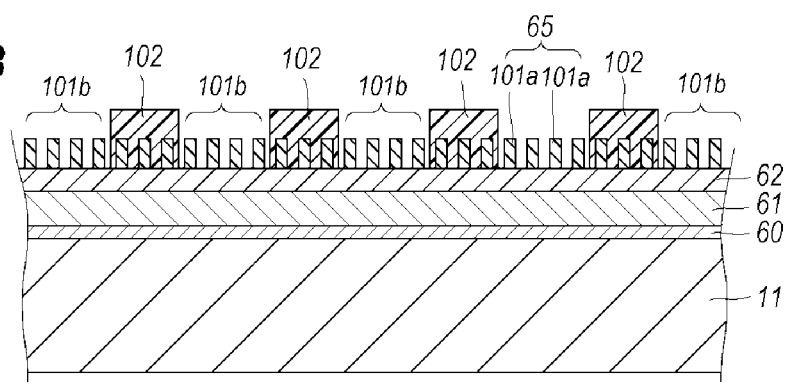
FIG. 10B shows a cross section of the semiconductor substrate taken along the line Xb-Xb indicated in FIG. 10A.
Figure 11A:
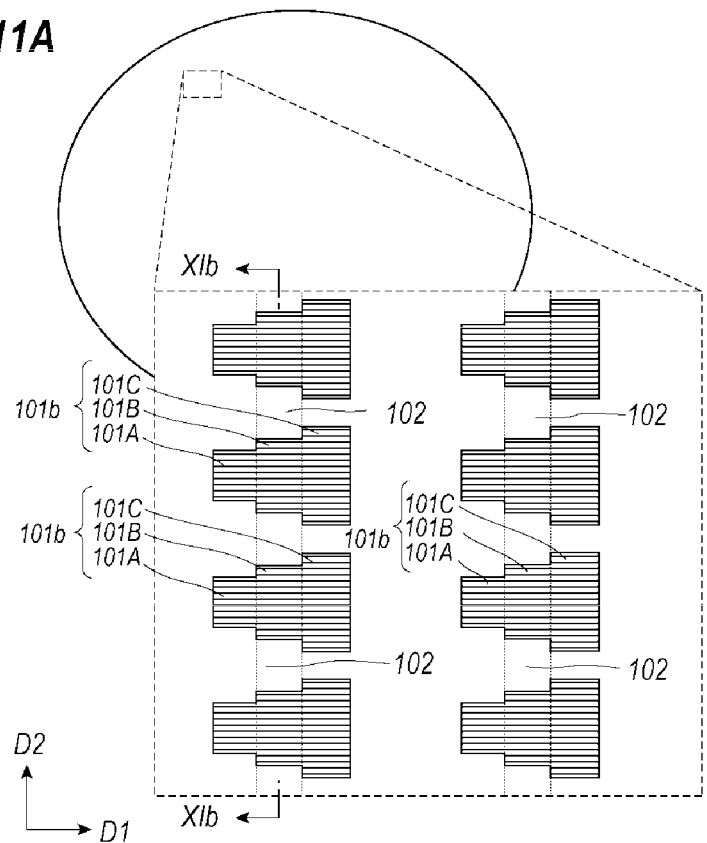
FIG. 11A is a plan view of the semiconductor substrate at a step of the process to form the diffraction grating patterns.

Next, a process to form an LD according to the second embodiment of the present invention will be described. The description below will omit explanations for elements same with or similar to those of the first embodiment. FIGS. 10A, 11A, and 12A, are plan views showing an LD in respective steps of the process according to the second embodiment. FIG. 10B shows a cross section of the LD taken along the line Xb-Xb indicated in FIG. 10A, FIG. 11B also shows a cross section of the LD taken along the line XIb-XIb indicated in FIG. 11A, and FIGS. 12B and 12C show cross sections of the LD taken along the line XIIb-XIIb and XIIc-XIIc, respectively each indicated in FIG. 12A.

In the process for the LD 1 of the second embodiment, similar to the first embodiment, after the formation of the resist stripes 101a by the first photoresist, the positive type photoresist, on the whole surface of the third semiconductor layer 62, refer to FIGS. 3A and 3B, a negative photoresist 102 with a thickness of 0.3 to 0.6 μm covers the whole resist stripes 101a; then, the negative-type photoresist 102 is illuminated. However, the process of the second embodiment illuminates regions corresponding to the grating regions, which is completely opposite to the first embodiment. That is, the first embodiment illuminates the negative type photoresist 102 in the grating regions so as to cover the grating regions by the negative type photoresist 102. The second embodiment leaves the negative type photoresist in the space regions except for the grating regions. Developing the negative photoresist 102, the negative photoresist 102 exposes the resist stripes 101a collectively in the grating regions but covers the resist stripes 101a in regions except for the grating regions, as shown in FIGS. 10A and 10B. The resist stripes 101a on the second semiconductor layer 62 in the grating regions exposes and those 101a in the space regions are covered with the patterned negative photoresist 102.

Figure 11B:
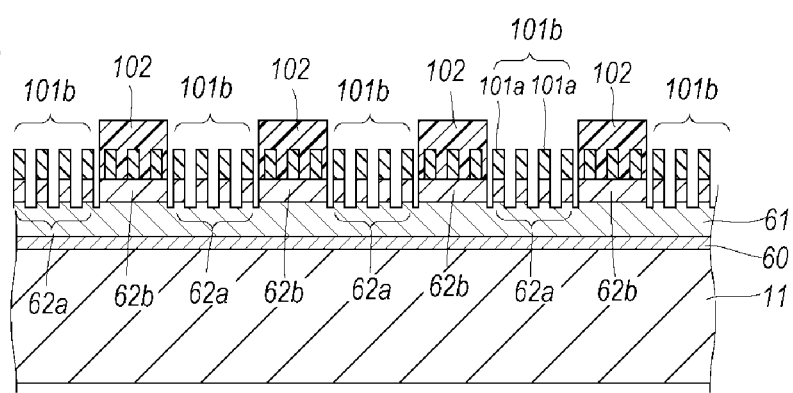
FIG. 11B shows a cross section of the semiconductor substrate taken along the line XIb-XIb indicated in FIG. 11A.
Figure 12A:
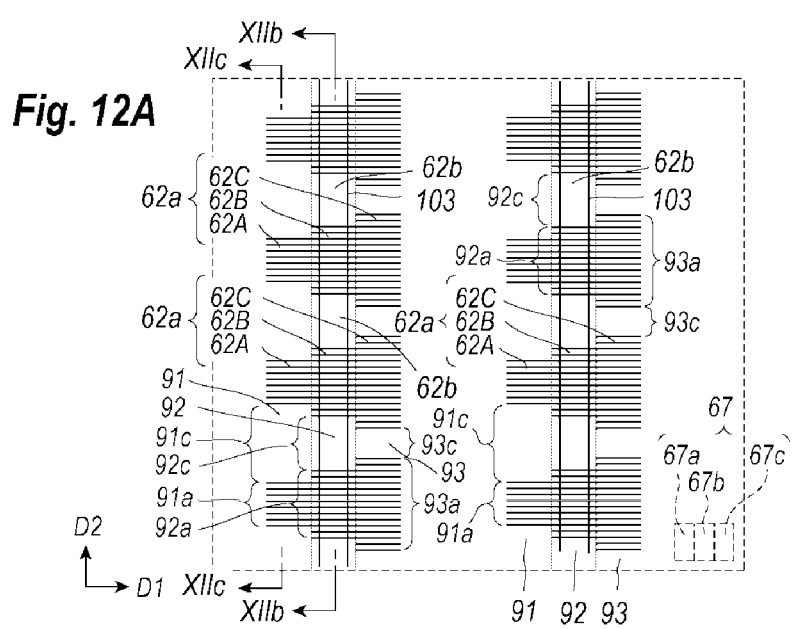
FIG. 12A is a plan view of the semiconductor substrate at a step of the process to form the mesa.
Figure 12B:
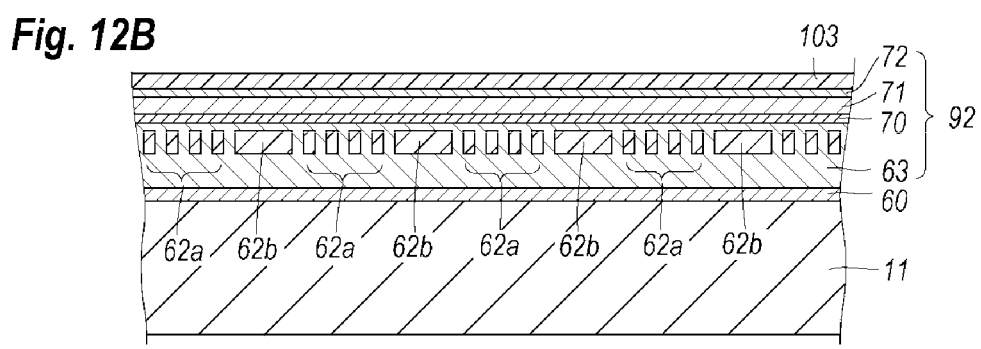
FIG. 12B shows a cross section of the semiconductor substrate taken along the line XIIb-XIIb indicated in FIG. 12A, which corresponds to the selected cavity pattern.
Figure 12C:
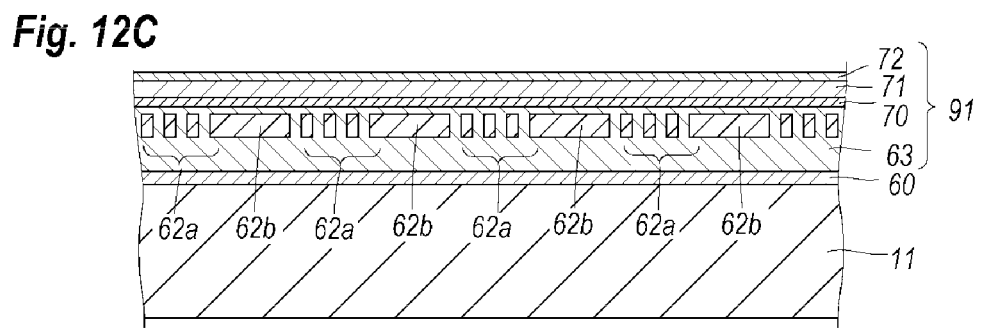
FIG. 12C shows a cross section of the semiconductor substrate taken along the line XIIc-XIIc appearing in FIG. 12A, which corresponds to the unselected cavity pattern.

Etching the second semiconductor layer 62 fully and the first semiconductor layer 61 partially, as shown in FIGS. 11A and 11B by using the resist stripes 101a and the patterned negative photoresist 102 as an etching mask, the diffraction grating patterns 62a and regions 62b with no diffraction grating patterns are formed in the third semiconductor layer 62. The diffraction grating patterns 62a and the left regions 62b are alternately arranged along the direction D2. After the etching above, the resist stripes 101a and the patterned negative photoresist 102 are removed, and subsequently the fourth to the seventh layers, 63 to 72, are sequentially and epitaxially grown. The diffraction grating patterns 62a and the left regions 62b are embedded by the fourth layer 63 to form the diffraction grating patterns 66, similar to the first embodiment, which are shown in FIGS. 12A to 12C. Also, before the second growth from the fifth semiconductor layer to the seventh semiconductor layer, the grating patterns 66 are inspected in shapes, widths, a partial length in respective grating regions, which means, the number of gratings provided in one grating region, and so on to select one of the grating regions in the subsequent step.

Similar to the aforementioned embodiment, an etching mask 103 is formed only on the selected cavity patterns, 91 to 93. Then, an etching, one of a dry-etching and a wet-etching, may remove the cavity patterns except for the selected cavity pattern using the mask 103 as an etching mask. In FIGS. 12A to 12C, the cavity pattern 92 that includes the grating regions 92a and the left regions 92c is selected, and only the second cavity pattern 92 is provided with the mask 103. The process removes the first and third cavity patterns, 91 and 93, where the first cavity pattern 91 is shown in FIG. 12C, to form a mesa in the second cavity pattern 92. On the other hand, FIG. 12B shows the cavity pattern 92, which is selected by the inspection after the formation of the diffraction gratings 66. As leaving the etching mask on the mesa 92, the mesa 92 is embedded with semiconductor layers, similar to the first embodiment shown in FIG. 8B.

The process according to the second embodiment may show advantages same with those of the first embodiment. In addition, the second embodiment etches the third semiconductor layer 63 only on regions exposed from the second photoresist 102, that is, the second photoresist 102 covers a large portion of the semiconductor substrate as exposing only between the resist stripes 102a in the grating regions, which may enhance the process stability of the etching.

In the foregoing detailed description, the method of the present invention has been described with reference to specific exemplary embodiments thereof. It will, however, be evident that various modifications and changes may be made thereto without departing from the broader spirit and scope of the present invention. For instance, the LD 1 thus described may further integrate an optical modulator in the outside of the SOA 5. Furthermore, the process may be applicable to a production of a wavelength tunable laser diode of a type of the tunable distributed amplification.

Also, the process of the present invention is unnecessary to prepare the alignment marks 67 during the process to etch the third semiconductor layer 62 to form the diffraction grating patterns 66. The alignment mark 67 may be prepared on an edge region of the semiconductor substrate 11 in the first step of the process. The inspection to select one of the cavity patterns may be simply carried out to count the number of the resist stripes 102b in the grating regions using the scanning electron microscope. Accordingly, the present specification and figures are to be regarded as illustrative rather than restrictive.

What is claimed is:

1. A method of producing a semiconductor laser diode (LD) that provides a sampled grating including grating regions each having a diffraction grating and space regions each having no diffraction grating, the grating regions and the space regions alternately arranged along an optical axis of the LD, the method comprising steps of:
   (a) epitaxially growing a first semiconductor layer and a second semiconductor layer in this order on a semiconductor substrate, wherein the first semiconductor layer, the second semiconductor layer, and the semiconductor substrate are made of indium phosphide (InP) related materials;
   (b) forming combinations in the first semiconductor layer and the second semiconductor layer, the combinations being laterally arrayed on the semiconductor substrate and each including the grating regions and the space regions, the grating region and the space region involved in one of the combinations having a summed length along the optical axis that is equal to a summed length along the optical axis of the grating region and the space region involved in other of the combinations but the grating region involved in the one of the combinations having a length along the optical axis that is different from a length, which is along the optical axis, of the grating region involved in the other of the combinations;
   (c) selecting the one of the combinations; and
   (d) removing the other of the combinations.

2. The method of claim 1,
wherein the step (d) includes a step of forming a mesa extending along the optical axis of the LD by etching the other of the combinations in respective sides of the mesa.

3. The method of claim 2,
wherein the step of forming the mesa includes a step of partially etching respective sides of the grating regions and the space regions in the one of the combinations, the respective sides of the mesa continuing the grating regions and the space regions in the the other of the combinations.

4. The method of claim 2,
further comprising, after the step of forming the mesa, a step of embedding the mesa by selectively growing a third semiconductor layer in the respective sides of the mesa.

5. The method of claim 2,
further comprising steps of, before forming the mesa, embedding the grating regions in the one of the combinations and the other of the combinations by selectively growing a third semiconductor layer that forms a lower cladding layer combined with the first semiconductor layer, the lower cladding layer having an even top surface; and
epitaxially growing an active layer, an upper cladding layer, and a contact layer sequentially on the even top surface of the lower cladding layer,
wherein the step of forming the mesa includes a step of etching the contact layer, the upper cladding layer, the active layer, and a portion of the lower cladding layer.

6. The method of claim 5,
wherein the first semiconductor layer, the second semiconductor layer, the lower cladding layer, the upper cladding layer, and the contact layer are made of InP, InGaAsP, InP, InP, and InGaAsP, respectively.

7. The method of claim 1,
wherein the step (b) includes a step of forming stripes in the second semiconductor layer in the grating regions, the stripes extending along a direction perpendicular to the optical axis and having a preset interval to form the diffraction grating, and
wherein the step (c) includes a step of counting a number of the stripes.

8. The method of claim 1,
wherein the step (b) includes a step of forming stripes in the second semiconductor layer in the grating regions, the stripes extending along a direction perpendicular to the optical axis and having a preset interval to form the diffraction grating, and
wherein the step (c) includes a step of inspecting shapes of the stripes.

9. A method of forming a sampled grating that includes grating regions each having a diffraction grating and space regions each having no diffraction gratings, the grating regions and the space regions being alternately arranged along an optical axis of the sampled grating, the method comprising steps of:
   (a) epitaxially growing a first semiconductor layer and a second semiconductor layer in this order sequentially on a semiconductor substrate;
   (b) forming resist stripes by a first photoresist on the second semiconductor layer, the resist stripes extending along a direction perpendicular to the optical axis and having a preset interval;
   (c) covering portions of the resist stripes by a second photoresist so as to form combinations of the grating regions and the space regions, the portions corresponding to the grating regions, the grating region and the space region involved in one of the combinations having a summed length along the optical axis that is equal to a summed length of the grating region and the space region involved in other of the combinations along the optical axis but the grating region involved in the one of the combinations having a length along the optical axis that is different from lengths, which are along the optical axis, of the grating regions involved in the other of the combinations;

(d) removing rest portions of the resist stripes exposed by the second photoresist, the rest portions corresponding to the space regions;

(e) removing the second photoresist covering the portions of the resist stripes;

(f) etching at least the second semiconductor layer by using the first photoresist as an etching mask so as to form stripes in the second semiconductor layer;

(g) selecting the one of the combinations of the grating regions and the space regions; and (h) embedding the stripes of second semiconductor layer by a third semiconductor layer having refractive index substantially same with refractive index of the first semiconductor layer but different from refractive index of the second semiconductor layer, the first and third semiconductor layers isolating the stripes of the second semiconductor layers.

10. The method of claim 9,
wherein the step (b) includes steps of:
coating the second semiconductor layer by the first photoresist of a positive type;
irradiating the first photoresist by an interference exposure using two beams; and
developing the irradiated first photoresist.

11. The method of claim 10,
wherein the step (c) includes steps of:
coating the resist stripes by the second photoresist of a negative type;
irradiating the second photoresist in regions corresponding to the grating regions; and
developing the second photoresist, the second photoresist in the space regions being removed by developing.

12. The method of claim 9,
wherein the step (d) includes a step of etching the resist stripes exposed by the second photoresist by dry-etching.

13. The method of claim 12,
wherein the step (e) includes a step of etching the second photoresist covering the grating regions by wet-etching.

14. The method of claim 9,
wherein the step (g) includes a step of counting a number of the stripes in the second semiconductor layer involved in the grating region.

15. The method of claim 9,
wherein the step (d) includes a step of inspecting shapes of the stripes in the second semiconductor layer involved in the grating region.

16. A method of forming a sampled grating that includes grating regions each having a diffraction grating and space regions each having no diffraction grating, the grating regions and the space regions being alternately arranged along an optical axis of the sampled grating, the method comprising steps of:

(a) epitaxially growing a first semiconductor layer and a second semiconductor layer in this order sequentially on a semiconductor substrate;

(b) forming resist stripes by a first photoresist on the second semiconductor layer, the resist stripes extending along a direction perpendicular to the optical axis and having one preset interval;

(c) covering portions of the resist stripes corresponding to the space regions by a second photoresist as exposing rest portions of the resist stripes corresponding to the grating regions so as to form combinations of the grating regions and the space regions, the grating region and the space region involved in one of the combinations having a summed length along the optical axis that is equal to a summed length, which is along the optical axis, of the grating region and the space region involved in other of the combinations but the grating region involved in the one of the combinations having a length along the optical axis that is different from lengths, which are along the optical axis, of the grating regions involved in the other of the combinations;

(d) etching at least the second semiconductor layer in the grating regions exposed by the second photoresist so as to form stripes in the second semiconductor layer;

(e) selecting one of the combinations;

(f) removing the second photoresist covering the space regions; and (g) embedding the stripes in the second semiconductor layer by a third semiconductor layer having refractive index substantially same with refractive index of the first semiconductor layer but different from refractive index of the second semiconductor layer, the first and third semiconductor layers isolating the stripes of the second semiconductor layer.

17. The method of claim 16,
wherein the step (b) includes steps of:
coating the second semiconductor layer by the first photoresist of a positive type;
irradiating the first photoresist by an interference exposure using two beams; and
developing the irradiated first photoresist.

18. The method of claim 17,
wherein the step includes steps of:
coating the resist stripes by the second photoresist of a negative type;
irradiating the second photoresist in regions corresponding to the space regions; and
removing the second photoresist in the grating regions by developing the second photoresist.

19. The method of claim 16,
wherein the step (f) includes a step of etching the second photoresist covering the grating regions by wet-etching.

20. The method of claim 16,
wherein the step (e) includes a step of counting a number of the stripes.

21. The method of claim 16,
wherein the step (e) includes a step of inspecting shapes of the stripes.

* * * * *